US010529751B2

(12) United States Patent
Shim et al.

(10) Patent No.: US 10,529,751 B2
(45) Date of Patent: Jan. 7, 2020

(54) EXPOSURE MASK AND METHOD OF MANUFACTURING A SUBSTRATE USING THE EXPOSURE MASK

(71) Applicant: Samsung Display Co., Ltd., Yongin-si (KR)

(72) Inventors: Seung-Bo Shim, Asan-si (KR); Jun-Gi Kim, Seoul (KR); Yong-Jun Park, Yongin-si (KR); Yang-Ho Jung, Seoul (KR); Jin-Ho Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/135,003

(22) Filed: Sep. 19, 2018

(65) Prior Publication Data

US 2019/0019819 A1    Jan. 17, 2019

Related U.S. Application Data

(63) Continuation of application No. 15/491,279, filed on Apr. 19, 2017, now Pat. No. 10,083,998, which is a
(Continued)

(30) Foreign Application Priority Data

Nov. 27, 2012    (KR) .................. 10-2012-0134921

(51) Int. Cl.
*H01L 27/12*    (2006.01)
*G03F 1/38*    (2012.01)
*G03F 1/22*    (2012.01)

(52) U.S. Cl.
CPC ............ *H01L 27/1288* (2013.01); *G03F 1/22* (2013.01); *G03F 1/38* (2013.01); *H01L 27/124* (2013.01)

(58) Field of Classification Search
CPC ...................................................... H01L 27/12
See application file for complete search history.

(56) References Cited

U.S. PATENT DOCUMENTS

| 6,306,769 | B1 | 10/2001 | Subramanian et al. |
| 7,804,097 | B2 | 9/2010 | Kang et al. |
| 2006/0187368 | A1 | 8/2006 | Kim et al. |

FOREIGN PATENT DOCUMENTS

| KR | 10-2008-0013163 | 2/2008 |
| KR | 10-2009-0009618 | 1/2009 |

(Continued)

OTHER PUBLICATIONS

Non-Final Office Action dated Feb. 10, 2016, in U.S. Appl. No. 13/835,314.
(Continued)

*Primary Examiner* — Marvin Payen
(74) *Attorney, Agent, or Firm* — H.C. Park & Associates, PLC

(57) ABSTRACT

An exposure mask includes a first transmission portion, a second transmission portion, and a blocking portion. The first transmission portion is configured to, when illuminated with light, transmit the light at a first energy level. The first transmission portion is disposed in association with formation of a first contact hole in an underlying layer. The second transmission portion is configured to, when illuminated with the light, transmit the light at a second energy level. The second transmission portion is disposed in association with formation of a second contact hole in the underlying layer. The blocking portion is configured to block the light, and is disposed in association with a boundary region between a first region and a second region of the underlying layer. The second transmission portion is further configured to enable (Continued)

the second contact hole to be formed deeper into the underlying layer than the first contact hole.

6 Claims, 10 Drawing Sheets

Related U.S. Application Data continuation of application No. 13/835,314, filed on Mar. 15, 2013, now abandoned.

(56) References Cited

FOREIGN PATENT DOCUMENTS

| | | |
|---|---|---|
| KR | 10-1054339 | 8/2011 |
| KR | 10-1148557 | 2/2012 |

OTHER PUBLICATIONS

Final Office Action dated Jul. 29, 2016, in U.S. Appl. No. 13/835,314.
Notice of Allowance dated Jan. 20, 2017, in U.S. Appl. No. 13/835,314.
Notice of Allowance dated May 22, 2018, in U.S. Appl. No. 15/491,279.
Office Action dated Jun. 26, 2019, in Korean Patent Application No. 10-2012-0134921.

EXPOSURE MASK AND METHOD OF MANUFACTURING A SUBSTRATE USING THE EXPOSURE MASK

CROSS-REFERENCE TO RELATED APPLICATIONS

This application is a Continuation of U.S. patent application Ser. No. 15/491,279, filed Apr. 19, 2017, which is a Continuation of U.S. patent application Ser. No. 13/835,314, filed Mar. 15, 2013, and claims priority from and the benefit of Korean Patent Application No. 10-2012-0134921, filed Nov. 27, 2012, each of which is incorporated by reference for all purposes as if set forth herein.

BACKGROUND

Field

Exemplary embodiments relate to lithographic exposure technology, and more particularly, to an exposure mask used in the manufacture of display substrates.

Discussion

A substrate, such as a display substrate, typically includes a base substrate, a gate layer disposed on the base substrate, a source/drain layer disposed on a portion of the gate layer, and an organic insulating layer disposed on the gate layer and the source/drain layer.

Typically, a gate driving part configured to output a gate signal to a gate line in the display substrate is disposed in a peripheral area of the display substrate. As such, an amorphous silicon gate (ASG) configured to output the gate signal to the gate line may be disposed on the display substrate.

The gate driving part typically includes a plurality of stages. Each of the stages usually includes a plurality of thin-film transistors. A gate electrode and a source electrode in the thin-film transistors may be electrically connected with each other, or the gate electrode and a drain electrode may be electrically connected with each other. As such, the gate layer and the source/drain layer may be connected with each other.

To effectuate the above-noted electrical connection(s), a first contact hole (or via) exposing the source/drain layer and a second contact hole exposing the gate layer may be formed through the organic insulating layer by patterning the organic insulating layer and depositing a conductive material to electrically connect the source/drain layer with the gate layer. Patterning may be achieved via one or more lithographic exposures.

A portion of the organic insulating layer disposed on the gate layer, however, may be thicker than a portion of the organic insulating layer disposed on the source/drain layer and the gate layer. Accordingly, if the patterning is done to form the first and second contact holes in the same process, the gate layer may not be exposed during an exposure of the organic insulating layer to expose the source/drain layer. As such, the gate layer may not be sufficiently exposed, and thereby, defects in the substrate may result. To this end, multiple exposure techniques may be utilized, but this can increase production costs, as well as introduce the possibility of alignment inconsistencies between multiple exposure masks. Therefore, there is a need for an approach that provides efficient, cost effective fabrication techniques to sufficiently pattern the organic insulating layer to expose underlying layers disposed at different depths and that also avoids defects.

The above information disclosed in this Background section is only for enhancement of understanding of the background of the invention and therefore it may contain information that does not form the prior art that is already known in this country to a person of ordinary skill in the art.

SUMMARY

Exemplary embodiments provide an exposure mask that, when utilized to pattern a substrate, is configured to decrease defects in the substrate.

Exemplary embodiments provide a method of manufacturing a substrate using the aforementioned exposure mask.

Additional aspects will be set forth in the detailed description which follows and, in part, will be apparent from the disclosure, or may be learned by practice of the invention.

According to exemplary embodiments, an exposure mask includes a first transmission portion, a second transmission portion, and a blocking portion. The first transmission portion is configured to, when illuminated with light, transmit the light at a first energy level. The first transmission portion is disposed in association with formation of a first contact hole in an underlying layer. The second transmission portion is configured to, when illuminated with the light, transmit the light at a second energy level. The second transmission portion is disposed in association with formation of a second contact hole in the underlying layer. The blocking portion is configured to block light. The blocking portion is disposed in association with a boundary region between a first region of the underlying layer and a second region of the underlying layer. The second transmission portion is further configured to enable the second contact hold to be formed deeper into the underlying layer than the first contact hole.

According to exemplary embodiments, a method of manufacturing a substrate, includes forming a gate layer on a substrate including a first region and a second region; forming a gate insulating layer on the gate layer; forming a semiconductor layer on the gate insulating layer in the first region; forming a source/drain layer on the semiconductor layer; and forming an organic insulating layer on the source/drain layer in the first region and on the gate insulating layer in the second region. The method further includes disposing, over the organic insulating layer, an exposure mask including a first transmission portion, a second transmission portion, and a blocking portion. The first transmission portion is disposed over the first region. The second transmission portion is disposed over the second region. The blocking portion is disposed over a boundary region between the first region and the second region. The first transmission portion is configured to, when illuminated with light, transmit the light at a first energy level. The second transmission portion is configured to, when illuminated with the light, transmit the light at a second energy level. The blocking portion is configured to block the light. The method further includes: illuminating the organic insulating layer through the exposure mask to form a first contact hole exposing the source/drain layer in the first region and a second contact hole exposing the gate layer in the second region. The second contact hole is formed deeper than the first contact hole. The method further comprises: forming a conductive material on the organic insulating layer. The conductive material connects the source/drain layer and the gate layer via the first contact hole and the second contact hole.

According to exemplary embodiments, a method includes: forming a layer on a substrate; and illuminating, for a duration, the layer with light through a reticle at least configured to facilitate formation of a first via and a second via in the layer, the reticle including: a first transmission portion associated with the first via, the first transmission portion being configured to, when illuminated with the light, transmit the light at a first energy level, and a second transmission portion associated with the second via, the second transmission portion being configured to, when illuminated with the light, transmit the light at a second energy level, wherein illuminating the layer for the duration at the first and second energy levels causes, at least in part, the second via to be formed deeper into the layer than the first via.

According to exemplary embodiments, a first contact hole and a second contact hole may be formed by patterning layers of different thicknesses in a first region and a second region of a substrate using an exposure mask including a first transmission portion through which a first energy of a light is transmitted and a second transmission portion through which a second energy of the light is transmitted. As such, defects in the substrate resulting from not exposing the thicker layer for a sufficient duration may be prevented or otherwise decreased.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
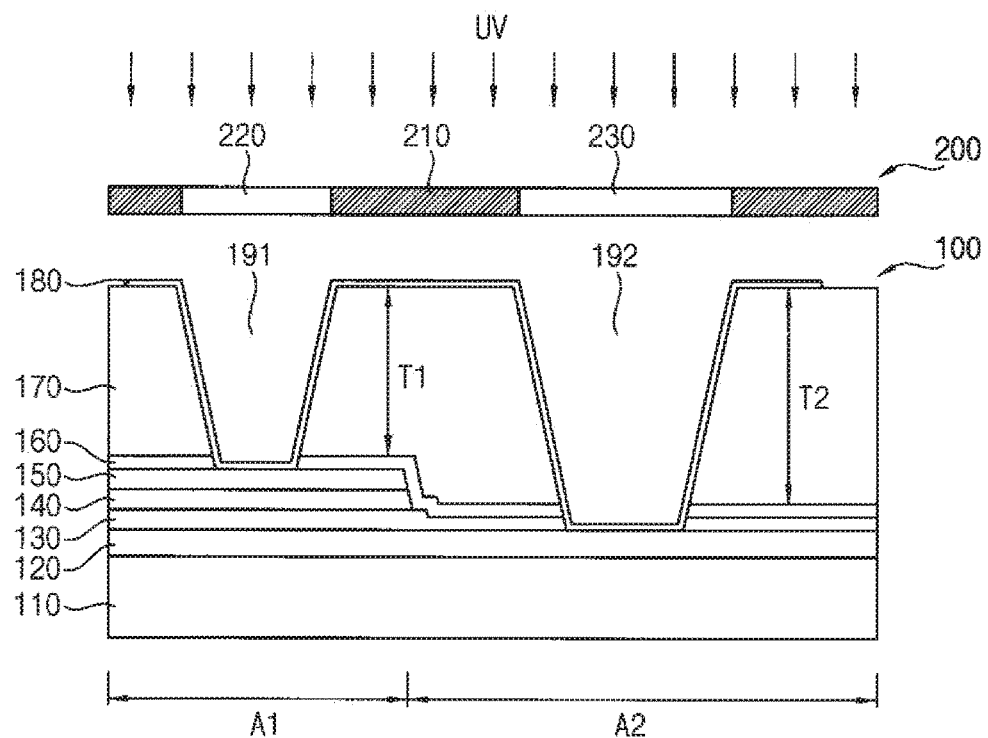
FIG. 1 is a cross-sectional view of an exposure mask and a substrate, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper," and/or the like, may be used herein for descriptive purposes, and thereby, to describe one element or feature's relationship to another element(s) or feature(s) as illustrated in the drawings. Spatially relative terms are intended to encompass different orientations of an apparatus in use or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and as such, the spatially relative descriptors used herein interpreted accordingly.

The terminology used herein is for the purpose of describing particular embodiments and is not intended to be limiting. As used herein, the singular forms "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

While exemplary embodiments are described in association with fabricating a display substrate, it is contemplated that exemplary embodiments may be utilized in association with fabricating any suitable substrate to include variable exposure depths.

FIG. 1 is a cross-sectional view of an exposure mask and a substrate, according to exemplary embodiments.

Referring to FIG. 1, the substrate 100 includes a base substrate 110, a gate layer 120, a gate insulating layer 130, a semiconductor layer 140, a source/drain layer 150, a passivation layer 160, an organic insulating layer 170, and a conductive electrode 180. The substrate 100 may be a display substrate of a display apparatus, such as a liquid crystal display (LCD) apparatus.

The base substrate 110 includes a first region A1 and a second region A2. The base substrate 110 may be a glass substrate, a plastic substrate, or the like.

The gate layer 120 is disposed on the base substrate 110. The gate layer 120 is disposed in the first region A1 and the second region A2. The gate layer 120 may include, for instance, one or more conductive materials, such as copper and titanium.

The gate insulating layer 130 is disposed on the gate layer 120. The gate insulating layer 130 is disposed in the first region A1 and the second region A2. The gate insulating layer 130 may include, for instance, silicon nitride, or any other suitable insulating material(s).

The semiconductor layer 140 is disposed on the gate insulating layer 130. The semiconductor layer 140 is disposed in the first region A1, but is not disposed in the second region A2. Since the semiconductor layer 140 is not disposed in the second region A2, the gate insulating layer 130 and the gate layer 120 may be exposed in the second region A2. While not illustrated, the semiconductor layer 140 may include an active layer and an ohmic-contact layer disposed on the active layer. The semiconductor layer 140 may include, for example, silicon; however, it is contemplated that any suitable semiconductor material may be utilized.

The source/drain layer 150 is disposed on the semiconductor layer 140. The source/drain layer 150 is disposed in the first region A1 and is not disposed in the second region A2. Since the source/drain layer 150 is not disposed in the second region A2, the gate insulating layer 130 and the gate layer 120 may be exposed in the second region A2. The source/drain layer 150 may include any suitable conductive material, such as copper and titanium.

The passivation layer 160 is disposed on the source/drain layer 160 and the gate insulating layer 130. The passivation layer 160 is disposed in the first region A1 and the second region A2. The passivation layer 160 may include silicon nitride; however, any other suitable passivation material may be utilized.

The organic insulating layer 170 is disposed on the passivation layer 160. The organic insulating layer 170 is disposed in the first region A1 and the second region A2. The semiconductor layer 140 and the source/drain layer 150 are disposed in the first region A1 and are not disposed in the second region A2, such that the organic insulating layer 170 includes a step difference in thickness in a boundary region between the first region A1 and the second region A2. As such, the portion of the organic insulating layer 170 disposed on the source/drain layer 150 in the first region A1 includes a first thickness T1, and the portion of the organic insulating layer 170 disposed on the gate layer 120 in the second region A2 includes a second thickness T2. As seen in FIG. 1, the second thickness T2 is greater than the first thickness T1.

A first contact hole 191 and a second contact hole 192 are formed through the organic insulating layer 170. The first contact hole 191 exposes the source/drain layer 150 in the first region A1, and the second contact hole 192 exposes the gate layer 120 in the second region A2. A size (e.g., terminating opening) of the second contact hole 192 may be equal to or greater than a corresponding size of the first contact hole 191. That is, a size of the second contact hole 192 at the gate layer 120 may be equal to or greater than a size of the first contact hole 191 at the source/drain layer 150. The first contact hole 191 and the second contact hole 192 may be formed using the exposure mask (or reticle) 200 during a same processing step.

The conductive electrode 180 is disposed on the organic insulating layer 170, and the conductive electrode 180 electrically connects the source/drain layer 150 and the gate layer 120. That is, the conductive electrode 180 electrically connects the source/drain layer 150 and the gate layer 120 through the first contact hole 191 and the second contact hole 192. The conductive electrode 180 may include any suitable conductive material, such as one or more transparent conductive materials, e.g., aluminum zinc oxide (AZO), fluorine tin oxide (FTO), indium cadmium oxide (ICO), indium tin oxide (ITO), indium zinc oxide (IZO), etc.

The gate layer 120 may be a gate electrode of a thin-film transistor (TFT) in a gate driving part (not shown) disposed on the base substrate 110. The gate driving part may be configured to output a gate signal to a gate line. The source/drain layer 150 may be a source electrode or a drain electrode of the TFT. Further, the conductive electrode 180 may be a bridge electrode electrically connecting the gate electrode with the source electrode or electrically connecting the gate electrode with the drain electrode.

Alternatively, the gate layer 120 may be a gate pad, the source/drain layer 150 may be a data pad, and the conductive electrode may be a bridge electrode electrically connecting the gate pad with the data pad.

According to exemplary embodiments, the exposure mask 200 is used to form the first contact hole 191 and the second contact hole 192 through the organic insulating layer 170 of the substrate 100. That is, after the organic insulating layer 170 is formed, the exposure mask 200 may be disposed over the organic insulating layer 170, and light UV may be selectively applied to the organic insulating layer 170. For example, the light UV may be ultraviolet light; however, any other suitable wavelength of light may be utilized.

The exposure mask 200 includes a blocking portion 210, a first transmission portion 220, and a second transmission portion 230. The exposure mask 200 may be a binary mask, phase-shift mask, and/or the like. While not illustrated, it is noted that the depicted mask pattern may be disposed on an underlying transparent substrate made of, for example, quartz. According to exemplary embodiments, the first and second transmission portions 220 and 230 may include one or more transparent and/or translucent materials configured to affect the energy of light UV exiting from the first and second transmission portions 220 and 230. The exposure mask 200 is described in more detail in association with FIGS. 2A and 2B.

Typically, a gate driving part configured to output a gate signal to a gate line in the display substrate is disposed in a peripheral area of the display substrate. As such, an amorphous silicon gate (ASG) configured to output the gate signal to the gate line may be disposed on the display substrate.

The gate driving part typically includes a plurality of stages. Each of the stages usually includes a plurality of thin-film transistors. A gate electrode and a source electrode in the thin-film transistors may be electrically connected with each other, or the gate electrode and a drain electrode may be electrically connected with each other. As such, the gate layer and the source/drain layer may be connected with each other.

Figure 2A:
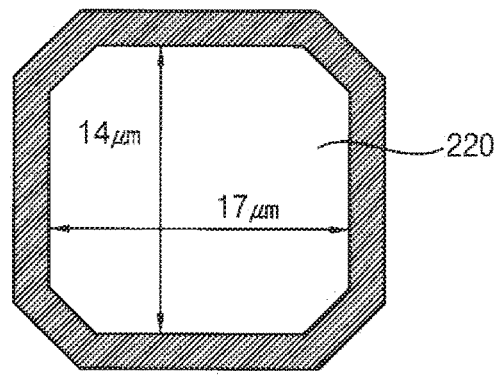
FIG. 2A is a plan view of a first transmission portion of the exposure mask of FIG. 1, according to exemplary embodiments.
Figure 2B:
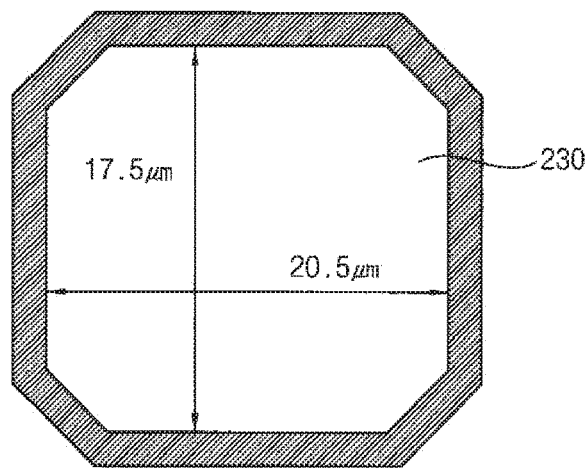
FIG. 2B is a plan view of a second transmission portion of the exposure mask of FIG. 1, according to exemplary embodiments.

FIGS. 2A and 2B are respective plan views of a first transmission portion and a second transmission portion of the exposure mask of FIG. 1, according to exemplary embodiments. For instance, FIG. 2A illustrates the first transmission portion 220 of the exposure mask 200 shown in FIG. 1, whereas FIG. 2B illustrates the second transmission portion 230 of the exposure mask 200 shown in FIG. 1.

Referring to FIGS. 1-2B, the blocking portion 210 is configured to block the light UV so that the light UV is not applied to the organic insulating layer 170 in a region corresponding to the blocking portion 210. In this manner, the blocking portion 210 corresponds to an area where the first contact hole 191 and the second contact hole 192 are not formed. As such, the blocking portion 210 is disposed adjacent to a boundary region between the first region A1 and the second region A2. The blocking portion 210 may include chrome; however, any other suitable material may be utilized.

The first transmission portion 220 is disposed in association with the first region A1. As such, the light UV may be transmitted through the first transmission portion 220 to expose the source/drain layer 150 in the first region A1. In this manner, the organic insulating layer 170 and the passivation layer 160 may be patterned (or otherwise etched) in the first region A1 to form the first contact hole 191 exposing the source/drain layer 150.

The second transmission portion 230 is disposed in association with the second region A2. As such, the light UV may be transmitted through the second transmission portion 230 to expose the gate layer 120 in the second region A2. In this manner, the organic insulating layer 170, the passivation layer 160, and the gate insulating layer 130 may be patterned (or otherwise etched) in the second region A2 to form the second contact hole 192 exposing the gate layer 120.

A first transmittance of the first transmission portion 220 and a second transmittance of the second transmission portion 230 may be substantially the same as each other.

The portion of the organic insulating layer 170 disposed on the source/drain layer 150 includes the first thickness T1, and the portion of the organic insulating layer 170 disposed on the gate layer 120 includes the second thickness T2, which may be greater than the first thickness T1. When energy of the light UV forming the first contact hole 191 and energy of the light UV forming the second contact hole 192 are the same as each other, the gate layer 120 may be not exposed in the second region A2 even though the source drain layer 150 is exposed in first region A1.

According to exemplary embodiments, the first transmission portion 220 includes a first length and the second transmission portion 230 includes a second length, which may be greater than the first length. The first and second lengths extend in a direction that the first region A1 and the second region A2 extend. In addition, the first transmission portion 220 includes a first area and the second transmission portion 230 includes a second area, which may be greater than the first area. For example, the first area of the first transmission portion 220 may be about 238 $\mu m^2$ (e.g., 14 $\mu m$*17 $\mu m$), and the second area of the second transmission portion 230 may be about 358.75 $\mu m^2$ (e.g., 17.5 $\mu m$*20.5 $\mu m$). It is noted, however, that the first transmission portion 220 and the second transmission portion 230 may not be formed as rectangular quadrilaterals, and therefore, the above-noted first and second areas may be approximations.

Given the sizing differentials of the first transmission portion 220 and the second transmission portion 230, the energy of the light UV transmitted through the second transmission portion 230 may be greater than the energy of the light UV transmitted through the first transmission portion 220. As such, the first contact hole 191 may be formed including a first size and the second contact hole 192 may be formed including a second size equal to or greater than the first size. The size of the opening diameters of the first contact hole 191 and the second contact hole 192 may be proportional to the resulting depths of the first contact 191 and the second contact hole 192. In this manner, the gate layer 120 may be exposed even though the portion of the organic insulating layer 170 disposed on the source/drain layer 150 includes the first thickness T1 and the portion of the organic insulating layer 170 disposed on the gate layer 120 includes the second thickness T2, which is thicker than the first thickness T1.

According to exemplary embodiments, the first contact hole 191 and the second contact hole 192 may be formed through the organic insulating layer 170 respectively including the first thickness T1 in the first region A1 and the second thickness T2 in the second region A2, using exposure mask 200 (e.g., a binary mask) including the first transmission portion 220 including the first area and the second transmission portion 230 including the second area, which is greater than the first area. As such, the source/drain layer 150 and the gate layer 120 may be exposed during a same processing step. Defects of the substrate 100 resulting from not exposing the gate layer 120 may be prevented or otherwise decreased.

Figure 3:
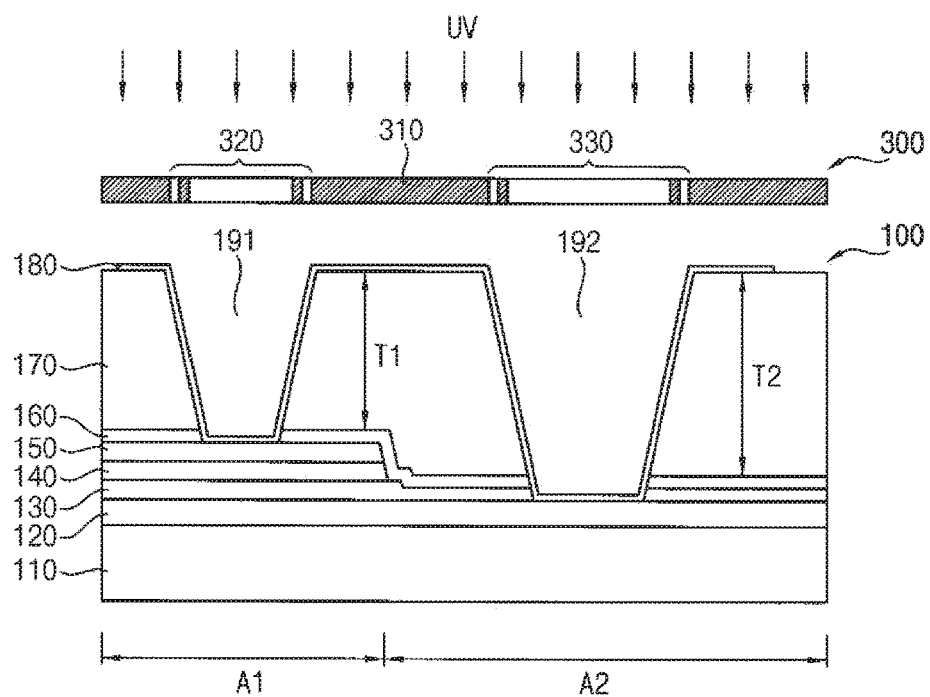
FIG. 3 is a cross-sectional view of an exposure mask and a substrate, according to exemplary embodiments.

FIG. 3 is a cross-sectional view of an exposure mask and a substrate, according to exemplary embodiments.

It is noted that the substrate 100 illustrated in FIG. 3 is substantially the same as the substrate 100 illustrated in FIG. 1. As such, the same reference numerals are used to refer to the same or like parts as those previously described, and therefore, further repetitive explanation will be omitted to avoid obscuring exemplary embodiments described herein.

Referring to FIG. 3, the substrate 100 includes the base substrate 110, the gate layer 120, the gate insulating layer 130, the semiconductor layer 140, the source/drain layer 150, the passivation layer 160, the organic insulating layer 170, and the conductive electrode 180.

The base substrate 110 includes the first region A1 and the second region A2. The gate layer 120 is disposed on the base substrate 110, and the gate layer 120 is disposed in the first region A1 and the second region A2. The gate insulating layer 130 is disposed on the gate layer 120, and the gate insulating layer 130 is disposed in the first region A1 and the second region A2. The semiconductor layer 140 is disposed on the gate insulating layer 130. The semiconductor layer 140 is disposed in the first region A1 and is not disposed in the second region A2. Since the semiconductor layer 140 is not disposed in the second region A2, the gate insulating layer 130 and the gate layer 120 may be exposed in the second region A2. The source/drain layer 150 is disposed on the semiconductor layer 140. The source/drain layer 150 is disposed in the first region A1 and is not disposed in the second region A2. Since the source/drain layer 150 is not disposed in the second region A2, the gate insulating layer 130 and the gate layer 120 may be exposed in the second region A2. The passivation layer 160 is disposed on the source/drain layer 160 and the gate insulating layer 130. The passivation layer 160 is disposed in the first region A1 and the second region A2.

The organic insulating layer 170 is disposed on the passivation layer 160. The organic insulating layer 170 is disposed in the first region A1 and the second region A2. The semiconductor layer 140 and the source/drain layer 150 are disposed in the first region A1 and are not disposed in the second region A2, such that the organic insulating layer 170 includes the step difference in thickness in the boundary region between the first region A1 and the second region A2. As such, the portion of the organic insulating layer 170 disposed on the source/drain layer 150 in the first region A1 includes the first thickness T1, and the portion of the organic insulating layer 170 disposed on the gate layer 120 in the second region A2 includes the second thickness T2. The second thickness T2 is greater than the first thickness T1.

The first contact hole (or via) 191 and the second contact hole (or via) 192 are formed through the organic insulating layer 170. The first contact hole 191 exposes the source/drain layer 150 in the first region A1, and the second contact hole 192 exposes the gate layer 120 in the second region A2.

The size (e.g., terminating opening) of the second contact hole 192 may be equal to or greater than the corresponding size of the first contact hole 191. That is, the size of the second contact hole 192 at the gate layer 120 is equal to or greater than the corresponding size of the first contact hole 191 at the source/drain layer 150.

The exposure mask (or reticle) 300 may be used to form the first contact hole 191 and the second contact hole 192 through the organic insulating layer 170 of the substrate 100 during a same processing step. That is, after the organic insulating layer 170 is formed, the exposure mask 300 may be disposed over the organic insulating layer 170, and the light UV may be selectively applied to the organic insulating layer 170 to pattern the first contact hole 191 and the second contact hole 192.

The exposure mask 300 includes a blocking portion 310, a first transmission portion 320, and a second transmission portion 330. While not illustrated, it is noted that the depicted mask pattern may be disposed on an underlying transparent substrate made of, for example, quartz. According to exemplary embodiments, the first and second transmission portions 320 and 330 may include one or more transparent and/or translucent materials configured to affect the energy of light UV exiting from the first and second transmission portions 320 and 330. The exposure mask 300 is described in more detail in association with FIGS. 4A and 4B.

Figure 4A:
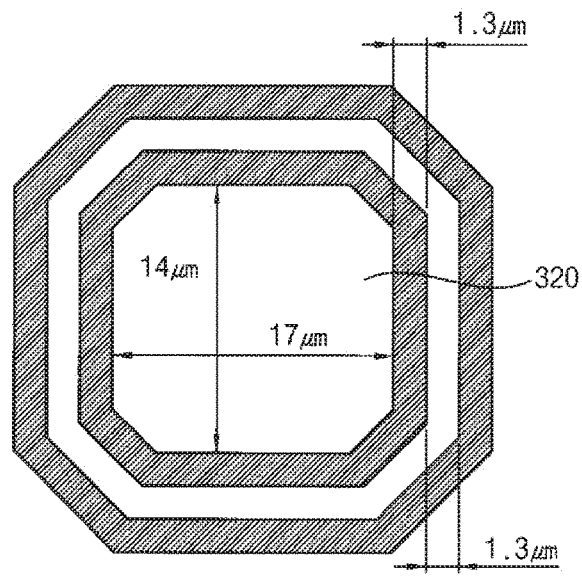
FIG. 4A is a plan view of a first transmission portion of the exposure mask of FIG. 3, according to exemplary embodiments.
Figure 4B:
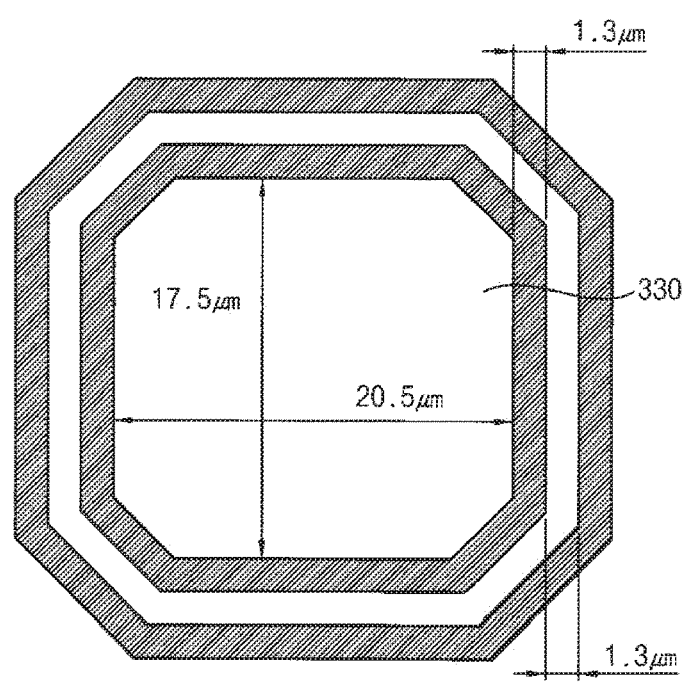
FIG. 4B is a plan view of a second transmission portion of the exposure mask of FIG. 3, according to exemplary embodiments.

FIGS. 4A and 4B are respective plan views of a first transmission portion and a second transmission portion of the exposure mask of FIG. 3, according to exemplary embodiments. For instance, FIG. 4A illustrates the first transmission portion 320 of the exposure mask 300 shown in FIG. 3, whereas FIG. 4B illustrates the second transmission portion 330 of the exposure mask 300 shown in FIG. 3.

Referring to FIGS. 3-4B, the blocking portion 310 is configured to block the light UV so that the light UV is not applied to the organic insulating layer 170 in a region corresponding to the blocking portion 310. In this manner, the blocking portion 310 corresponds to the area where the first contact hole 191 and the second contact hole 192 are not formed. As such, the blocking portion 310 is disposed adjacent to the boundary region between the first region A1 and the second region A2. The blocking portion 310 may include chrome; however, any other suitable material may be utilized.

The first transmission portion 320 is disposed in association with the first region A1. As such, the light UV may be transmitted through the first transmission portion 320 to expose the source/drain layer 150 in the first region A1. In this manner, the organic insulating layer 170 and the passivation layer 160 may be patterned in the first region A1, and thereby, the first contact hole 191 exposing the source/drain layer 150 may be formed.

The second transmission portion 330 is disposed in association with the second region A2. As such, the light UV may be transmitted through the second transmission portion 330 to expose the gate layer 120 in the second region A2. In this manner, the organic insulating layer 170, the passivation layer 160, and the gate insulating layer 130 may be patterned, and the second contact hole 192 exposing the gate layer 120 may be formed.

According to exemplary embodiments, each of the first transmission portion 320 and the second transmission portion 330 may be configured to include at least one slit, e.g., respective concentric slits correspondingly disposed about the first transmission portion 320 and the second transmission portion 330. While only one slit is illustrated with respect to each of the first transmission portion 320 and the second transmission portion 330, it is contemplated that multiple slits may be utilized, such as described in association with FIGS. 9-10B. Further, spacing between slits may be constant and/or variable. As such, the exposure mask 300 may be a slit mask. For example, in a portion forming the slit, a width of a line blocking the light UV may be about 1.3 and a width of a spacer through which the light UV is transmitted may be about 1.3 It is noted that the respective slits associated with the first transmission portion 320 and the second transmission portion 330 may be configured to correspondingly affect the energy and/or intensity of light UV propagating therefrom, such that the energy and/or intensity of light UV exiting from the second transmission portion 330 is greater than the energy and/or intensity of light UV exiting from the first transmission portion 320.

As previously mentioned, the portion of the organic insulating layer 170 disposed on the source/drain layer 150 includes the first thickness T1, and the portion of the organic insulating layer 170 disposed on the gate layer 120 includes the second thickness T2, which is thicker than the first thickness T1. When energy of the light UV forming the first contact hole 191 and energy of the light UV forming the second contact hole 192 are the same, the gate layer 120 may be not exposed in the second region A2 even though the source drain layer 150 is exposed in first region A1.

According to exemplary embodiments, the first transmission portion 320 includes a first length and the second transmission portion 330 includes a second length, which may be greater than the first length. The first and second lengths extend in a direction that the first region A1 and the second region A2 extend. In addition, the first transmission portion 320 includes a first area and the second transmission portion 330 includes a second area, which may be greater than the first area.

Given the sizing differentials of the first transmission portion 320 and the second transmission portion 330, the energy of the light UV transmitted through the second transmission portion 330 may be greater than the energy of the light UV transmitted through the first transmission portion 320. As such, the first contact hole 191 may be formed including the first size, and the second contact hole 192 may be formed including the second size equal to or greater than the first size. The size of the opening diameters of the first contact hole 191 and the second contact hole 192 may be proportional to the resulting depths of the first contact hole 191 and the second contact hole 192. In this manner, the gate layer 120 may be exposed even though the portion of the organic insulating layer 170 disposed on the source/drain layer 150 includes the first thickness T1 and the portion of the organic insulating layer 170 disposed on the gate layer 120 includes the second thickness T2, which is greater than the first thickness T1.

According to exemplary embodiments, the first contact hole 191 and the second contact hole 192 may be formed through the organic insulating layer 170 respectively including the first thickness T1 in the first region A1 and the second thickness T2 in the second region A2, using exposure mask 300 (e.g., a slit mask) including the first transmission portion 320 including the first area and the second transmission portion 330 including the second area, which is greater than the first area. As such, the source/drain layer 150 and the gate layer 120 may be exposed during a same processing step. Defects of the substrate 100 resulting from the gate layer 120 not being sufficiently exposed may be prevented or otherwise decreased.

Figure 5:
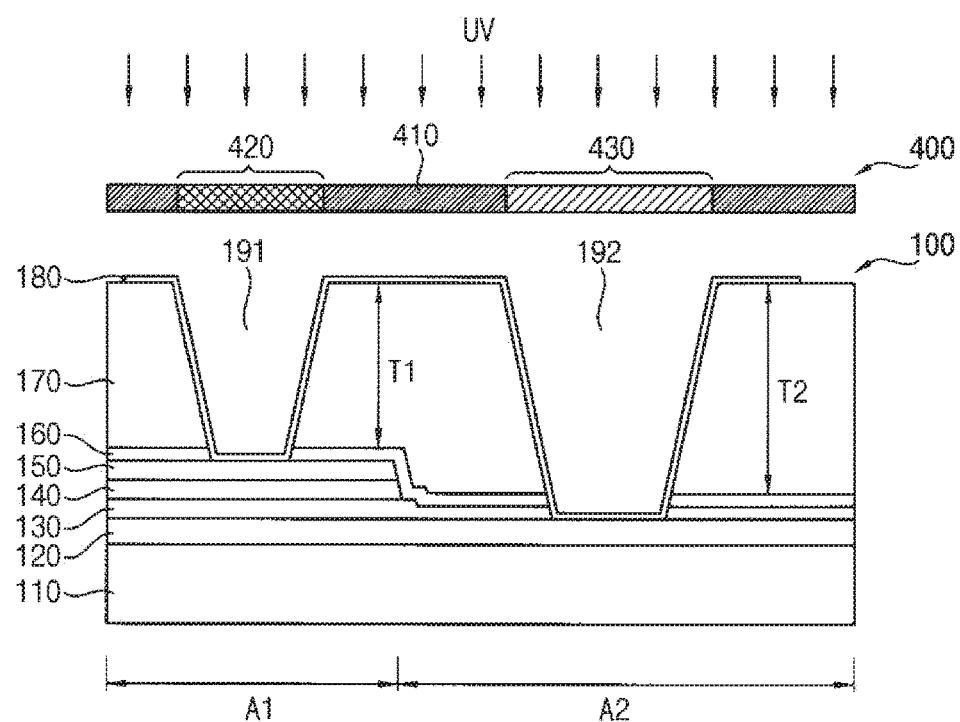
FIG. 5 is a cross-sectional view of an exposure mask and a substrate, according to exemplary embodiments.

FIG. 5 is a cross-sectional view of an exposure mask and a substrate, according to exemplary embodiments.

It is noted that the substrate 100 illustrated in FIG. 5 is substantially the same as the substrate illustrated in FIG. 1. As such, the same reference numerals are used to refer to the same or like elements as those previously described, and therefore, any further repetitive explanation will be omitted to avoid obscuring exemplary embodiments described herein.

Referring to FIG. 5, the substrate 100 includes the base substrate 110, the gate layer 120, the gate insulating layer 130, the semiconductor layer 140, the source/drain layer 150, the passivation layer 160, the organic insulating layer 170, and the conductive electrode 180.

The base substrate 110 includes the first region A1 and the second region A2. The gate layer 120 is disposed on the base substrate 110, and the gate layer 120 is disposed in the first region A1 and the second region A2. The gate insulating layer 130 is disposed on the gate layer 120, and the gate insulating layer 130 is disposed in the first region A1 and the second region A2. The semiconductor layer 140 is disposed on the gate insulating layer 130. The semiconductor layer 140 is disposed in the first region A1 and is not disposed in the second region A2. Since the semiconductor layer 140 is not disposed in the second region A2, the gate insulating layer 130 and the gate layer 120 may be exposed in the second region A2. The source/drain layer 150 is disposed on the semiconductor layer 140. The source/drain layer 150 is disposed in the first region A1 and is not disposed in the second region A2. Since the source/drain layer 150 is not disposed in the second region A2, the gate insulating layer 130 and the gate layer 120 may be exposed in the second region A2. The passivation layer 160 is disposed on the source/drain layer 160 and the gate insulating layer 130. The passivation layer 160 is disposed in the first region A1 and the second region A2.

The organic insulating layer 170 is disposed on the passivation layer 160. The organic insulating layer 170 is disposed in the first region A1 and the second region A2. The semiconductor layer 140 and the source/drain layer 150 are disposed in the first region A1 and are not disposed in the second region A2, such that the organic insulating layer 170 includes the step difference in thickness in the boundary region between the first region A1 and the second region A2. As such, the portion of the organic insulating layer 170 disposed on the source/drain layer 150 in the first region A1 includes the first thickness T1, and the portion of the organic insulating layer 170 disposed on the gate layer 120 in the second region A2 includes the second thickness T2. The second thickness is greater than the first thickness T1.

The first contact hole (or via) 191 and the second contact hole (or via) 192 are formed through the organic insulating layer 170. The first contact hole 191 exposes the source/drain layer 150 in the first region A1, and the second contact hole 192 exposes the gate layer 120 in the second region A2. The size (e.g., terminating opening) of the second contact hole 192 may be equal to or greater than the corresponding size of the first contact hole 191. That is, the size of the second contact hole 192 at the gate layer 120 may be equal to or greater than the corresponding size of the first contact hole 191 at the source/drain layer 150.

The exposure mask (or reticle) 400 may be used to form the first contact hole 191 and the second contact hole 192 through the organic insulating layer 170 of the substrate 100 during a same processing step. That is, after the organic insulating layer 170 is formed, the exposure mask 400 may be disposed over the organic insulating layer 170, and the light UV may be selectively applied to the organic insulating layer 170 to pattern the first contact hole 191 and the second contact hole 192.

The exposure mask 400 includes a blocking portion 410, a first transmission portion 420, and a second transmission portion 430. While not illustrated, it is noted that the depicted mask pattern may be disposed on an underlying transparent substrate made of, for example, quartz. According to exemplary embodiments, the first and second transmission portions 420 and 430 may include one or more transparent and/or translucent materials configured to affect the energy of light UV exiting from the first and second transmission portions 420 and 430. The exposure mask 400 is described in more detail in association with FIGS. 6A and 6B.

Figure 6A:
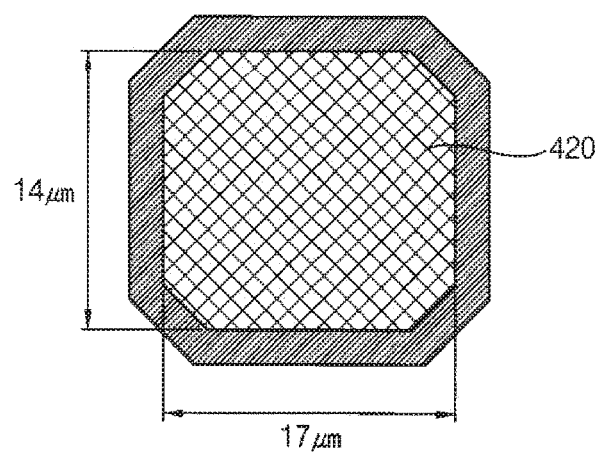
FIG. 6A is a plan view of a first transmission portion of the exposure mask of FIG. 5, according to exemplary embodiments.
Figure 6B:
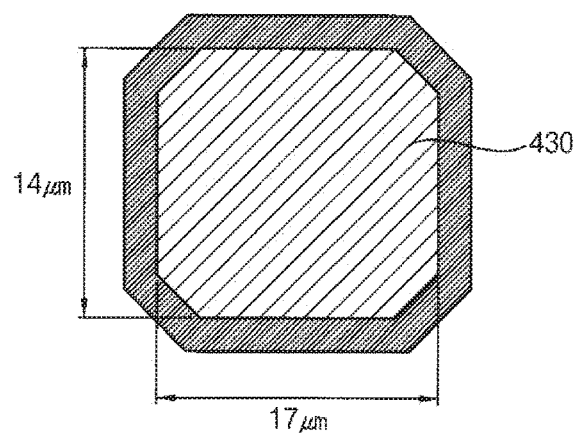
FIG. 6B is a plan view of a second transmission portion of the exposure mask of FIG. 5, according to exemplary embodiments.

FIGS. 6A and 6B are respective plan views of a first transmission portion and a second transmission portion of the exposure mask of FIG. 5, according to exemplary embodiments. For instance, FIG. 6A illustrates the first transmission portion 420 of the exposure mask 400 shown in FIG. 5, whereas FIG. 6B illustrates the second transmission portion 430 of the exposure mask 400 shown in FIG. 5.

Referring to FIGS. 5-6B, the blocking portion 410 is configured to block the light UV so that the light UV is not applied to the organic insulating layer 170 in a region corresponding to the blocking portion 410. In this manner, the blocking portion 410 corresponds to the area where the first contact hole 191 and the second contact hole 192 are not disposed. As such, the blocking portion 410 is disposed adjacent to the boundary region between the first region A1 and the second region A2. The blocking portion 410 may include chrome; however, any other suitable material may be utilized.

The first transmission portion 420 is disposed in association with the first region A1. As such, the light UV may be transmitted through the first transmission portion 420 to expose the source/drain layer 150 in the first region A1. In this manner, the organic insulating layer 170 and the passivation layer 160 may be patterned in the first region A1, and the first contact hole 191 exposing the source/drain layer 150 may be formed.

The second transmission portion 430 is disposed in association with the second region A2. As such, the light UV may be transmitted through the second transmission portion 430 to expose the gate layer 120 in the second region A2. In this manner, the organic insulating layer 170, the passivation layer 160, and the gate insulating layer 130 may be patterned, and the second contact hole 192 exposing the gate layer 120 may be formed.

According to exemplary embodiments, the first transmission portion 420 includes a first halftone film, and the second transmission portion 430 includes a second halftone film. As such, the exposure mask 400 may be a halftone mask.

As previously mentioned, the portion of the organic insulating layer 170 disposed on the source/drain layer 150 includes the first thickness T1, and the portion of the organic insulating layer 170 disposed on the gate layer 120 includes the second thickness T2, which is thicker than the first thickness T1. When energy of the light UV forming the first contact hole 191 and energy of the light UV forming the second contact hole 192 are the same, the gate layer 120 may be not exposed in the second region A2 even though the source drain layer 150 is exposed in first region A1.

According to exemplary embodiments, the first transmission portion 420 includes a first transmittance, and the second transmission portion 430 includes a second transmittance. That is, the first halftone film in the first transmission portion 420 includes the first transmittance, and the second halftone film in the second transmission portion 430 includes the second transmittance, which may be greater than the first transmittance. In this manner, the differences in the first and second halftone films associated with the corresponding transmittances may be configured to correspondingly affect the energy and/or intensity of light UV propagating therefrom, such that the energy and/or intensity of light UV exiting from the second transmission portion 430 is greater than the energy and/or intensity of light UV exiting from the first transmission portion 420. Since light energy and/or intensity may be affected via the respective transmittances of the first and second halftone films, the sizing of the respective first and second transmission portions 420 and 430 may be substantially the same, but since the energy and/or intensity of light UV propagating therefrom may be different, the corresponding depths of the first contact hole 191 and the second contact hole 192 may be proportionally affected.

Given the sizing and/or transmittance differences between the first transmission portion 420 and the second transmission portion 430, the energy of the light UV transmitted through the second transmission portion 430 may be greater than the energy of the light UV transmitted through the first transmission portion 420. As such, the first contact hole 191 may be formed including the first size, and the second contact hole 192 may be formed including the second size equal to or greater than the first size. The size of the opening diameters of the first contact hole 191 and the second contact hole 192 may be proportional to the resulting depths of the first contact hole 191 and the second contact hole 192. In this manner, the gate layer 120 may be exposed even though the portion of the organic insulating layer 170 disposed on the source/drain layer 150 includes the first thickness T1 and the portion of the organic insulating layer 170 disposed on the gate layer 120 includes the second thickness T2, which is greater than the first thickness T1.

According to exemplary embodiments, a first length of the first transmission portion 420 and a second length of the second transmission portion 430 may be substantially the same, such as in a direction that the first region A1 and the second region A2 extend. In addition, a first area of the first transmission portion 420 and a second area of the second transmission portion 430 may be substantially the same. Additionally or alternatively, the second length of the second transmission portion 430 may be greater than the first length of the first transmission portion 420. In addition, the second area of the second transmission portion 430 may be greater than the first area of the first transmission portion 420.

While exemplary embodiments have been described, such that the first transmission portion 420 includes the first halftone film and the second transmission portion 430 includes the second halftone film, exemplary embodiments may be alternatively configured. For example, the second transmission portion 430 may not include the second halftone film. In this manner, the halftone film associated with the first transmission portion and the sizing of the second transmission portion 430 may be utilized to control the energy and/or intensity of light UV propagating therefrom, and thereby, proportionally affect the depth at which first contact hole 191 and second contact hold 192 extend.

According exemplary embodiments, the first contact hole 191 and the second contact hole 192 may be formed through the organic insulating layer 170 respectively including the first thickness T1 in the first region A1 and the second thickness T2 in the second region A2, using exposure mask 400 (e.g., a halftone mask) including the first transmission portion 420 including the first transmittance and the second transmission portion 430 including the second transmittance, which is greater than the first transmittance. As such, the source/drain layer 150 and the gate layer 120 may be exposed during a same processing step. Defects of the substrate 100 resulting from the gate layer 120 not being sufficiently exposed may be prevented or otherwise decreased.

Figure 7:
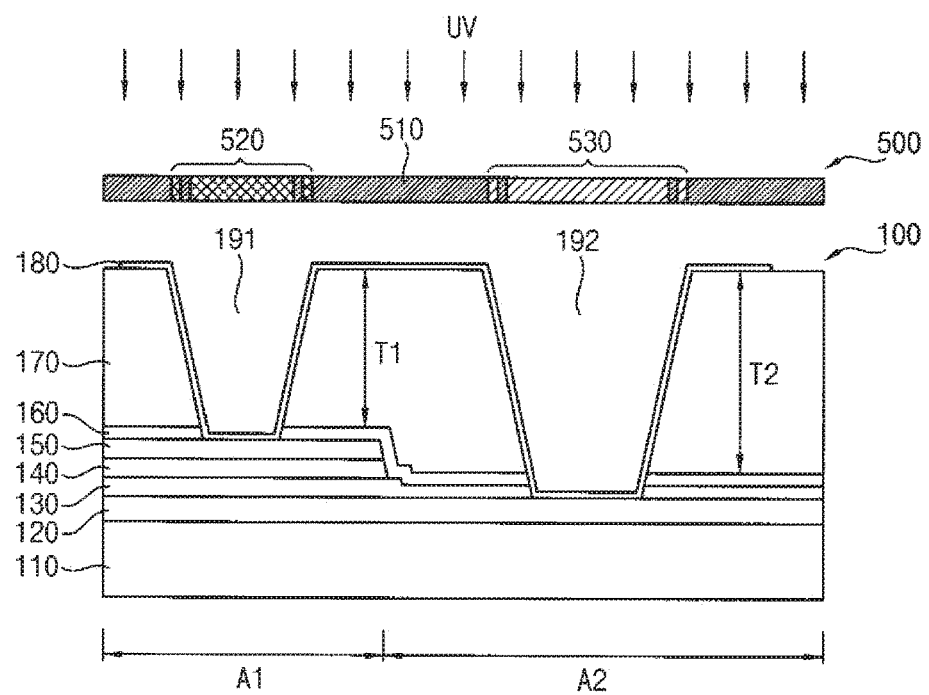
FIG. 7 is a cross-sectional view of an exposure mask and a substrate, according to exemplary embodiments.

FIG. 7 is a cross-sectional view of an exposure mask and a substrate, according to exemplary embodiments.

It is noted that the substrate 100 illustrated in FIG. 5 is substantially the same as the substrate 100 illustrated in FIG. 1. As such, the same reference numerals are used to refer to the same or like parts as those previously described, and therefore, any further repetitive explanation will be omitted to avoid obscuring exemplary embodiments described herein.

Referring to FIG. 7, the substrate 100 includes the base substrate 110, the gate layer 120, the gate insulating layer 130, the semiconductor layer 140, the source/drain layer 150, the passivation layer 160, the organic insulating layer 170, and the conductive electrode 180.

The base substrate 110 includes the first region A1 and the second region A2. The gate layer 120 is disposed on the base substrate 110, and the gate layer 120 is disposed in the first region A1 and the second region A2. The gate insulating layer 130 is disposed on the gate layer 120, and the gate insulating layer 130 is disposed in the first region A1 and the second region A2. The semiconductor layer 140 is disposed on the gate insulating layer 130. The semiconductor layer 140 is disposed in the first region A1 and is not disposed in the second region A2. Since the semiconductor layer 140 is not disposed in the second region A2, the gate insulating layer 130 and the gate layer 120 may be exposed in the second region A2. The source/drain layer 150 is disposed on the semiconductor layer 140. The source/drain layer 150 is disposed in the first region A1 and is not disposed in the second region A2. Since the source/drain layer 150 is not disposed in the second region A2, the gate insulating layer 130 and the gate layer 120 may be exposed in the second region A2. The passivation layer 160 is disposed on the source/drain layer 160 and the gate insulating layer 130. The passivation layer 160 is disposed in the first region A1 and the second region A2.

The organic insulating layer 170 is disposed on the passivation layer 160. The organic insulating layer 170 is disposed in the first region A1 and the second region A2. The semiconductor layer 140 and the source/drain layer 150 are disposed in the first region A1 and are not disposed in the second region A2, such that the organic insulating layer 170 includes the step difference in thickness in the boundary region between the first region A1 and the second region A2. As such, the portion of the organic insulating layer 170 disposed on the source/drain layer 150 in the first region A1 includes the first thickness T1, and the portion of the organic insulating layer 170 disposed on the gate layer 120 in the second region A2 includes the second thickness T2. The second thickness is greater than the first thickness T1.

The first contact hole (or via) 191 and the second contact hole (or via) 192 are formed through the organic insulating layer 170. The first contact hole 191 exposes the source/drain layer 150 in the first region A1, and the second contact hole 192 exposes the gate layer 120 in the second region A2. The size (e.g., terminating opening) of the second contact hole 192 may be equal to or greater than the corresponding size of the first contact hole 191. That is, the size of the second contact hole 192 at the gate layer 120 may be equal to or greater than the corresponding size of the first contact hole 191 at the source/drain layer 150.

The exposure mask (or reticle) 500 may be used to form the first contact hole 191 and the second contact hole 192 through the organic insulating layer 170 of the substrate 100 during a same processing step. That is, after the organic insulating layer 170 is formed, the exposure mask 500 may be disposed over the organic insulating layer 170, and the light UV may be selectively applied to the organic insulating layer 170 to pattern the first contact hole 191 and the second contact hole 192.

The exposure mask 500 includes a blocking portion 510, a first transmission portion 520, and a second transmission portion 530. While not illustrated, it is noted that the depicted mask pattern may be disposed on an underlying transparent substrate made of, for example, quartz. According to exemplary embodiments, the first and second transmission portions 520 and 530 may include one or more transparent and/or translucent materials configured to affect the energy of light UV exiting from the first and second transmission portions 520 and 530. The exposure mask 500 is described in more detail in association with FIGS. 8A and 8B.

Figure 8A:
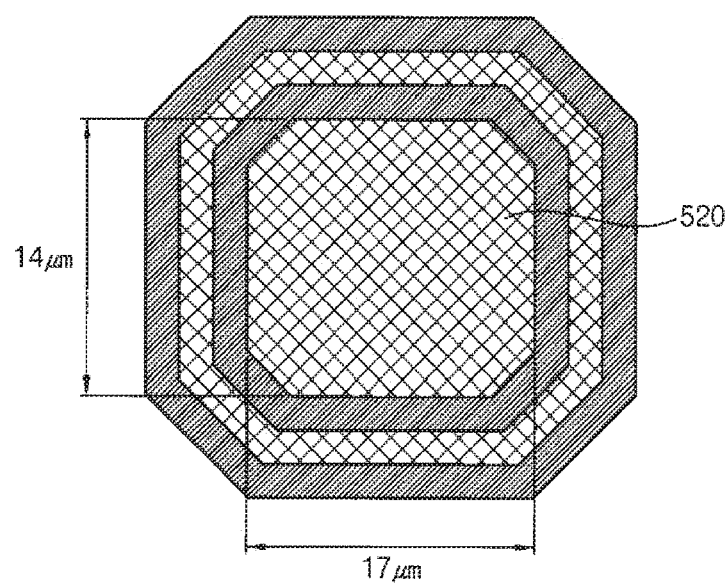
FIG. 8A is a plan view of a first transmission portion of the exposure mask of FIG. 7, according to exemplary embodiments.
Figure 8B:
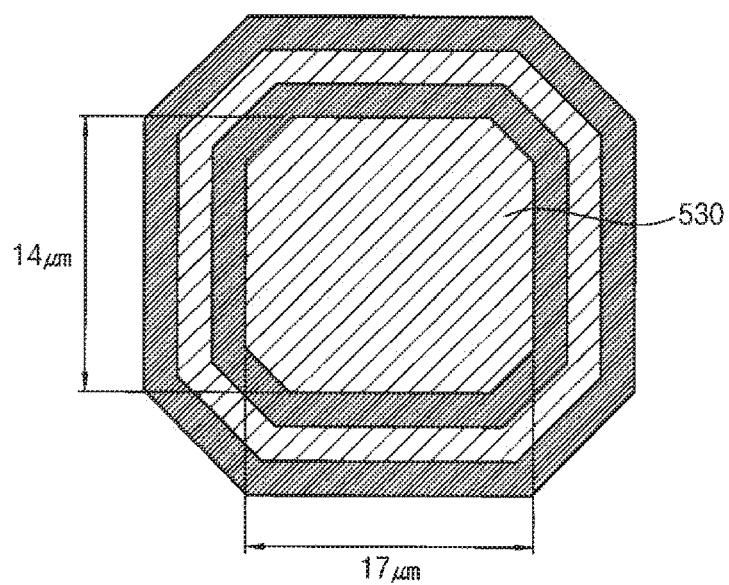
FIG. 8B is a plan view of a second transmission portion of the exposure mask of FIG. 7, according to exemplary embodiments.

FIGS. 8A and 8B are respective plan views of a first transmission portion and a second transmission portion of the exposure mask of FIG. 7, according to exemplary embodiments. For instance, FIG. 8A illustrates the first transmission portion 520 of the exposure mask 500 shown in FIG. 7, whereas FIG. 8B illustrates the second transmission portion 530 of the exposure mask 500 shown in FIG. 7.

Referring to FIGS. 7-8B, the blocking portion 510 is configured to block the light UV so that the light UV is not applied to the organic insulating layer 170 in a region corresponding to the blocking portion 510. In this manner, the blocking portion 510 corresponds to the area where the first contact hole 191 and the second contact hole 192 are not disposed. As such, the blocking portion 510 is disposed adjacent to the boundary region between the first region A1 and the second region A2. The blocking portion 510 may include chrome; however, any other suitable material may be utilized.

The first transmission portion 520 is disposed in association with the first region A1. As such, the light UV may be transmitted through the first transmission portion 520 to expose the source/drain layer 150 in the first region A1. In this manner, the organic insulating layer 170 and the passivation layer 160 may be patterned in the first region A1, and the first contact hole 191 exposing the source/drain layer 150 may be formed.

The second transmission portion 530 is disposed in association with the second region A2. As such, the light UV may be transmitted through the second transmission portion 530 to expose the gate layer 120 in the second region A2. In this manner, the organic insulating layer 170, the passivation layer 160, and the gate insulating layer 130 may be patterned in the second region A2, and the second contact hole 192 exposing the gate layer 120 may be formed.

According to exemplary embodiments, the first transmission portion 520 includes a first halftone film, and the second transmission portion 530 includes a second halftone film. As such, the exposure mask 500 may be a halftone mask. In addition, each of the first transmission portion 520 and the second transmission portion 530 may include at least one slit, such as described in association with FIGS. 3-4B. Thus, the exposure mask 500 may be a halftone, slit mask.

As previously mentioned, the portion of the organic insulating layer 170 disposed on the source/drain layer 150 includes the first thickness T1, and the portion of the organic insulating layer 170 disposed on the gate layer 120 includes the second thickness T2, which is thicker than the first thickness T1. When energy of the light UV forming the first contact hole 191 and energy of the light UV forming the second contact hole 192 are the same, the gate layer 120 may be not exposed in the second region A2 even though the source drain layer 150 is exposed in first region A1.

According to exemplary embodiments, the first transmission portion 520 includes a first transmittance, and the second transmission portion 530 includes a second transmittance. That is, the first halftone film in the first transmission portion 520 may contribute to a portion of the first transmittance, and the second halftone film in the second transmission portion 530 may contributed to the second transmittance, which is greater than the first transmittance. To this end, the respective slits and/or sizing associated with the first transmission portion 520 and the second transmission portion 530 may also contribute to the corresponding first and second transmittances. In this manner, one or more differences in the first and second halftone films, the respective slits, and the respective sizing may be configured to correspondingly affect the energy and/or intensity of light UV exiting from the respective first and second transmission portions 520 and 530, such that the energy and/or intensity of light UV exiting from the second transmission portion 530 is greater than the energy and/or intensity of light UV exiting from the first transmission portion 520. Since light energy and/or intensity may be affected via the respective transmittances of the first and second halftone films and the respective slits, the sizing of the respective first and second transmission portions 520 and 530 may be substantially the same, but since the energy and/or intensity of light UV propagating therethrough may be different, the corresponding depths of the first contact hole 191 and the second contact hole 192 may be proportionally affected.

Given the sizing, slits, and/or transmittance differences between the first transmission portion 530 and the second transmission potion 530, the energy of the light UV transmitted through the second transmission portion 530 may be greater than the energy of the light UV transmitted through the first transmission portion 520. As such, the first contact hole 191 may be formed including the first size, and the second contact hole 192 may be formed including the second size equal to or greater than the first size. The size of the opening diameters of the first contact hole 191 and the second contact hole 192 may be proportional to the resulting depths of the first contact hole 191 and the second contact hole 192. In this manner, the gate layer 120 may be exposed even though the portion of the organic insulating layer 170 disposed on the source/drain layer 150 includes the first thickness T1 and the portion of the organic insulating layer 170 disposed on the gate layer 120 includes the second thickness T2, which is greater than the first thickness T1.

According to exemplary embodiments, a first area of the first transmission portion 520 and a second area of the second transmission portion 530 may be substantially the same. Alternatively, the second area of the second transmission portion 530 may be greater than the first area of the first transmission portion 520.

While exemplary embodiments have been described, such that the first transmission portion 520 includes the first halftone film and the second transmission portion 530 includes the second halftone film, exemplary embodiments may be alternatively configured. For example, the second transmission portion 530 may not include the second halftone film. In this manner, the halftone film and/or the sizing associated with the first transmission portion, and the sizing and slits of the second transmission portion 430 may be utilized to control the energy and/or intensity of light UV propagating therefrom, and thereby, proportionally affect the depth at which first contact hole 191 and second contact hold 192 extend.

According to exemplary embodiments, the first contact hole 191 and the second contact hole 192 may be formed through the organic insulating layer 170 respectively including the first thickness T1 in the first region A1 and the second thickness T2 in the second region A2, using exposure mask 500 (e.g., a halftone, slit mask) including the first transmission portion 520 including the first transmittance and the slit, and the second transmission portion 530 including the second transmittance, which is greater than the first transmittance, and the slit. As such, the source/drain layer 150 and the gate layer 120 may be exposed during a same processing step. Defects of the substrate 100 resulting from the gate layer 120 not being sufficiently exposed may be prevented or otherwise decreased.

Figure 9:
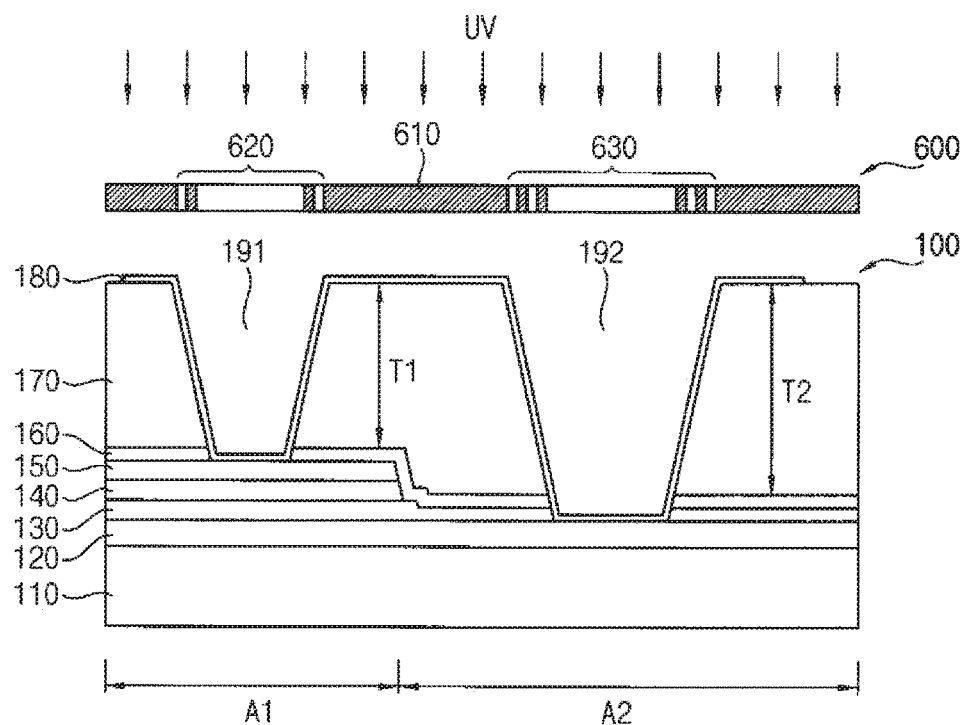
FIG. 9 is a cross-sectional view of an exposure mask and a substrate, according to exemplary embodiments.

FIG. 9 is a cross-sectional view of an exposure mask and a substrate, according to exemplary embodiments.

It is noted that the substrate 100 illustrated in FIG. 9 is substantially the same as the substrate 100 illustrated in FIG. 1. As such, the same reference numerals are used to refer to the same or like parts as those previously described, and therefore, any further repetitive explanation will be omitted to avoid obscuring exemplary embodiments described herein.

Referring to FIG. 9, the substrate 100 includes the base substrate 110, the gate layer 120, the gate insulating layer 130, the semiconductor layer 140, the source/drain layer 150, the passivation layer 160, the organic insulating layer 170, and the conductive electrode 180.

The base substrate 110 includes the first region A1 and the second region A2. The gate layer 120 is disposed on the base substrate 110, and the gate layer 120 is disposed in the first region A1 and the second region A2. The gate insulating layer 130 is disposed on the gate layer 120, and the gate insulating layer 130 is disposed in the first region A1 and the second region A2. The semiconductor layer 140 is disposed on the gate insulating layer 130. The semiconductor layer 140 is disposed in the first region A1 and is not disposed in the second region A2. Since the semiconductor layer 140 is not disposed in the second region A2, the gate insulating layer 130 and the gate layer 120 may be exposed in the second region A2. The source/drain layer 150 is disposed on the semiconductor layer 140. The source/drain layer 150 is disposed in the first region A1 and is not disposed in the second region A2. Since the source/drain layer 150 is not exposed in the second region A2, the gate insulating layer 130 and the gate layer 120 may be exposed in the second region A2. The passivation layer 160 is disposed on the source/drain layer 160 and the gate insulating layer 130. The passivation layer 160 is disposed in the first region A1 and the second region A2.

The organic insulating layer 170 is disposed on the passivation layer 160. The organic insulating layer 170 is disposed in the first region A1 and the second region A2. The semiconductor layer 140 and the source/drain layer 150 are disposed in the first region A1 and are not disposed in the second region A2, such that the organic insulating layer 170 includes the step difference in thickness in the boundary region between the first region A1 and the second region A2. As such, the portion of the organic insulating layer 170 disposed on the source/drain layer 150 in the first region A1 includes the first thickness T1, and the portion of the organic insulating layer 170 disposed on the gate layer 120 in the second region A2 includes the second thickness T2. The second thickness is greater than the first thickness T1.

The first contact hole (or via) 191 and the second contact hole (or via) 192 are formed through the organic insulating layer 170. The first contact hole 191 exposes the source/drain layer 150 in the first region A1, and the second contact hole 192 exposes the gate layer 120 in the second region A2. The size (e.g., terminating opening) of the second contact hole 192 may be equal to or greater than the corresponding size of the first contact hole 191. That is, the size of the second contact hole 192 at the gate layer 120 may be equal to or greater than the corresponding size of the first contact hole 191 at the source/drain layer 150.

The exposure mask (or reticle) 600 may be used to form the first contact hole 191 and the second contact hole 192 through the organic insulating layer 170 of the substrate 100 during a same processing step. That is, after the organic insulating layer 170 is formed, the exposure mask 600 may be disposed over the organic insulating layer 170, and the light UV may be selectively applied to the organic insulating layer 170 to pattern the first contact hole 191 and the second contact hole 192.

The exposure mask 600 includes a blocking portion 610, a first transmission portion 620, and a second transmission portion 630. While not illustrated, it is noted that the depicted mask pattern may be disposed on an underlying transparent substrate made of, for example, quartz. According to exemplary embodiments, the first and second transmission portions 620 and 630 may include one or more transparent and/or translucent materials configured to affect the energy of light UV exiting from the first and second transmission portions 620 and 630. The exposure mask 600 is described in more detail in association with FIGS. 10A and 10B.

Figure 10A:
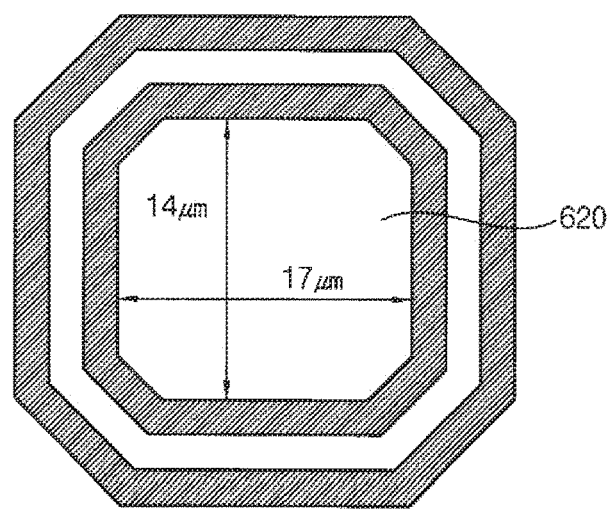
FIG. 10A is a plan view of a first transmission portion of the exposure mask of FIG. 9, according to exemplary embodiments.
Figure 10B:
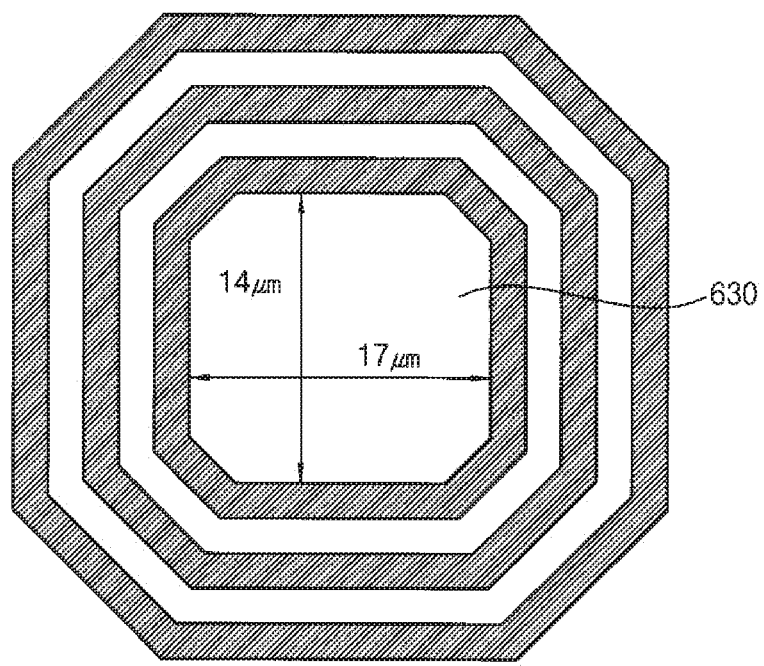
FIG. 10B is a plan view of a second transmission portion of the exposure mask of FIG. 9, according to exemplary embodiments.

FIGS. 10A and 10B are respective plan views of a first transmission portion and a second transmission portion of the exposure mask of FIG. 9, according to exemplary embodiments. For instance, FIG. 10A illustrates the first transmission portion 620 of the exposure mask 600 shown in FIG. 9, whereas FIG. 10B illustrates the second transmission portion 630 of the exposure mask 600 shown in FIG. 9.

Referring to FIGS. 9-10B, the blocking portion 610 is configured to block the light UV so that the light UV is not applied to the organic insulating layer 170 in a region corresponding to the blocking portion 610. In this manner, the blocking portion 610 corresponds to the area where the first contact hole 191 and the second contact hole 192 are not disposed. As such, the blocking portion 510 is disposed adjacent to the boundary region between the first region A1 and the second region A2. The blocking portion 610 may include chrome; however, any other suitable material may be utilized.

The first transmission portion 620 is disposed in association with the first region A1. As such, the light UV may be transmitted through the first transmission portion 620 to expose the source/drain layer 150 in the first region A1. In this manner, the organic insulating layer 170 and the passivation layer 160 may be patterned in the first region A1, and the first contact hole 191 exposing the source/drain layer 150 may be formed.

The second transmission portion 630 is disposed in association with the second region A2. As such, the light UV may be transmitted through the second transmission portion 630 to expose the gate layer 120 in the second region A2. In this manner, the organic insulating layer 170, the passivation layer 160, and the gate insulating layer 130 may be patterned in the second region A2, and the second contact hole 192 exposing the gate layer 120 may be formed.

According to exemplary embodiments, each of the first transmission portion 620 and the second transmission portion 630 includes at least one slit e.g., respective concentric slits correspondingly disposed about the first transmission portion 620 and the second transmission portion 630. As previously mentioned in association with FIG. 3, one or more of the first and second transmission portions 620 and 630 may include multiple slits. Further, spacing between slits may be constant and/or variable. As seen in FIG. 9, first transmission portion 620 includes one slit, whereas second transmission portion 630 includes a plurality of slits (e.g., two slits). In any event, the exposure mask 600 may be a slit mask.

As previously mentioned, the portion of the organic insulating layer 170 disposed on the source/drain layer 150 includes the first thickness T1, and the portion of the organic insulating layer 170 disposed on the gate layer 120 includes the second thickness T2, which is thicker than the first thickness T1. When energy of the light UV forming the first contact hole 191 and energy of the light UV forming the second contact hole 192 are the same, the gate layer 120 may be not exposed in the second region A2 even though the source drain layer 150 is exposed in first region A1.

According to exemplary embodiments, the first transmission portion 620 includes a first length and the second transmission portion 630 includes a second length, which may be greater than the first length. In addition, the first transmission portion 620 includes a first area and the second transmission portion 630 includes a second area, which may be greater than the first area. Further, the number of the slits in the second transmission portion 630 is greater than the number of the slits in the first transmission portion 620. In this manner, one or more differences in the sizing and/or number of slits may be configured to correspondingly affect the energy and/or intensity of light UV exiting from the respective first and second transmission portions 620 and 630, such that the energy and/or intensity of light UV exiting from the second transmission portion 630 is greater than the energy and/or intensity of light UV exiting from the first transmission portion 620.

Given the sizing, the slits, and/or the number of slits, the energy of the light UV transmitted through the second transmission portion 630 may be greater than the energy of the light UV transmitted through the first transmission portion 620. As such, the first contact hole 191 includes the first size, the second contact hole 192 includes the second size equal to or greater than the first size. The size of the opening diameters of the first contact hole 191 and the second contact hole 192 may be proportional to the resulting depths of the first contact hole 191 and the second contact hole 192. In this manner, the gate layer 120 may be exposed even though the portion of the organic insulating layer 170 disposed on the source/drain layer 150 includes the first thickness T1 and the portion of the organic insulating layer 170 disposed on the gate layer 120 includes the second thickness T2, which is greater than the first thickness T1.

According to exemplary embodiments, the first contact hole 191 and the second contact hole 192 may be formed through the organic insulating layer 170 respectively including the first thickness T1 in the first region A1 and the second thickness T2 in the second region A2, using exposure mask 600 (e.g., a slit mask) including the first transmission portion 620 including the first area and the slit and the second transmission portion 630 including the second area greater than the first area and the plurality of slits. As such, the source/drain layer 150 and the gate layer 120 may be exposed during a same processing step. Defects of the substrate 100 resulting from the gate layer 120 not being sufficiently exposed may be prevented or otherwise decreased.

Figure 11A:
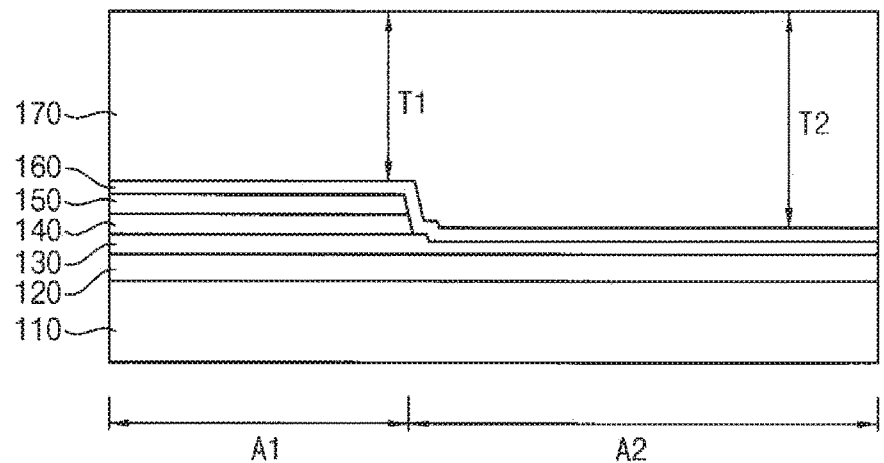
FIGS. 11A-11C are cross-sectional views of a substrate during one or more manufacturing processes, according to exemplary embodiments.
Figure 11B:
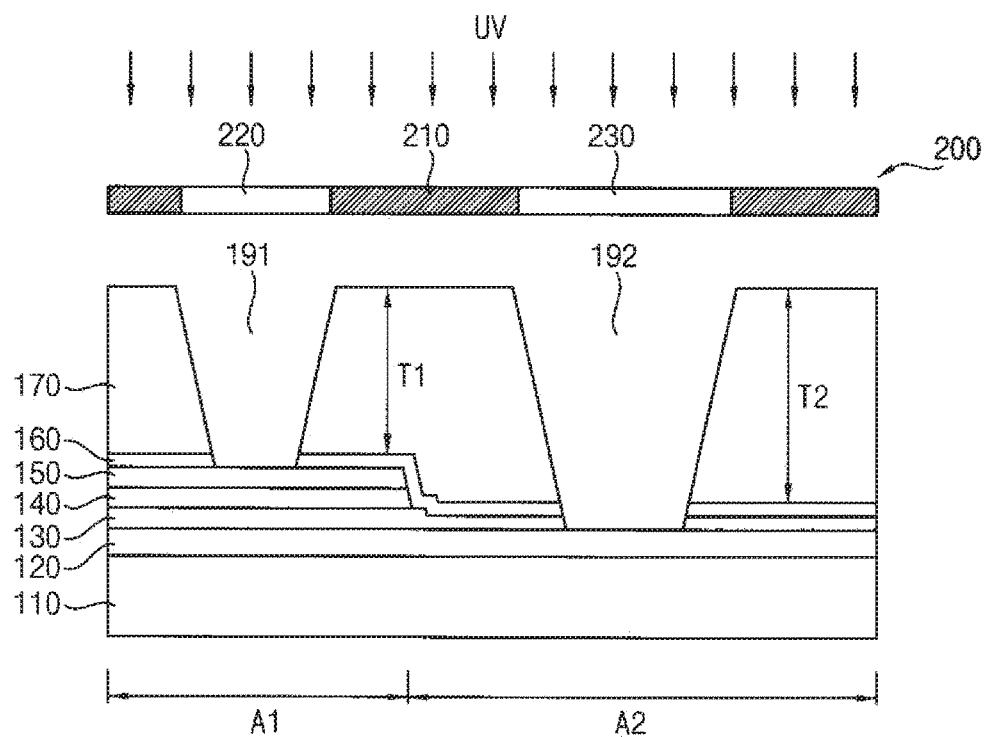
Figure 11C:
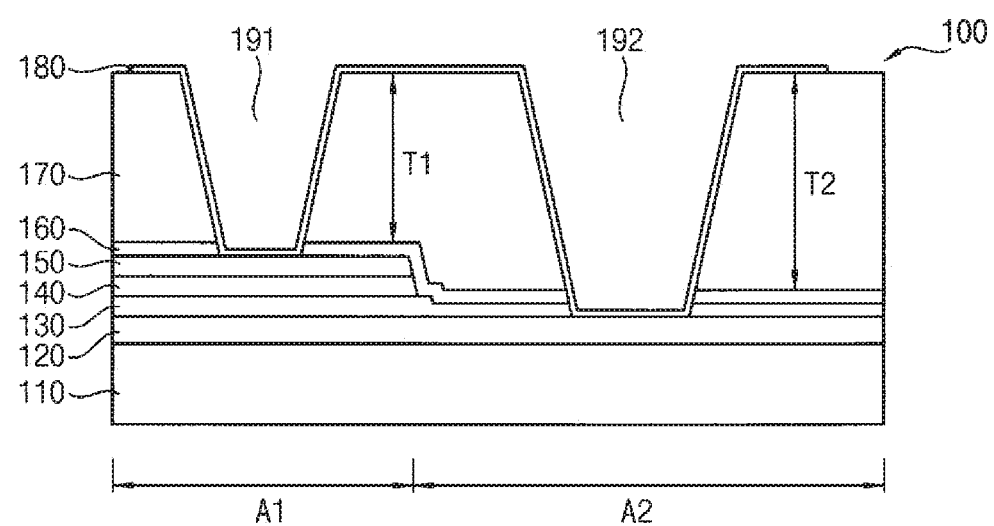

FIGS. 11A-11C are cross-sectional views of a substrate during one or more manufacturing processes, according to exemplary embodiments.

It is noted that the substrate 100 illustrated in FIGS. 11A-11C is substantially the same as the substrate 100 illustrated in FIG. 1. Further, an exposure mask 200 illustrated in FIG. 11B is substantially the same as the exposure mask 200 illustrated in FIG. 1. As such, the same reference numerals are used to refer to the same or like parts as those previously described, and therefore, any further repetitive explanation will be omitted to avoid obscuring exemplary embodiments described herein.

Referring to FIG. 11A, the gate layer 120 is formed on the base substrate 110, which includes the first region A1 and the second region A2. The gate layer 120 is formed in the first region A1 and the second region A2.

The gate insulating layer 130 is formed on the gate layer 120. The gate insulating layer 130 is formed in the first region A1 and the second region A2.

The semiconductor layer 140 is formed on the gate insulating layer 130. The semiconductor layer 140 is formed in the first region A1, but is not formed in the second region A2. Since the semiconductor layer 140 is not formed in the second region A2, the gate insulating layer 130 and the gate layer 120 are exposed in the second region A2.

The source/drain layer 150 is formed on the semiconductor layer 140. The source/drain layer 150 is formed in the first region A1, but is not formed in the second region A2. Since the source/drain layer 150 is not formed in the second region A2, the gate insulating layer 130 and the gate layer 120 are exposed in the second region A2.

The passivation layer 160 is formed on the source/drain layer 150 and the gate insulating layer 130. In this manner, the passivation layer 160 is formed in the first region A1 and the second region A2.

The organic insulating layer 170 is formed on the passivation layer 160. The organic insulating layer 170 is formed in the first region A1 and the second region A2. The semiconductor layer 140 and the source/drain layer 150 are formed in the first region A1, but are not formed in the second region A2. In this manner, the organic insulating layer 170 includes the step difference in thickness in the boundary region between the first region A1 and the second region A2. As such, the portion of the organic insulating layer 170 disposed on the source/drain layer 150 in the first region A1 includes the first thickness T1, and the portion of the organic insulating layer 170 disposed on the gate layer 120 in the second region A2 includes the second thickness T2, which is thicker than the first thickness T1.

Referring to FIG. 11B, the exposure mask 200 is disposed over the organic insulating layer 170. The exposure mask 200 includes the blocking portion 210, the first transmission portion 220, and the second transmission portion 230. The blocking portion 210 is disposed adjacent to the boundary region between the first region A1 and the second region A2.

The first transmission portion 220 includes the first area and the first transmission portion 220 is disposed in association with the first region A1. The light UV is transmitted through the first transmission portion 220 to expose the source/drain layer 150 in the first region A1. As such, the organic insulating layer 170 and the passivation layer 160 may be patterned in the first region A1, and the first contact hole 191 exposing the source/drain layer 150 is formed.

The second transmission portion 230 includes the second area greater than the first area and the second transmission portion 230 is disposed in association with the second region A2. While the light UV is being transmitted through the first transmission portion, the light UV is also transmitted through the second transmission portion 230 to expose the gate layer 120 in the second region A2. As such, the organic insulating layer 170, the passivation layer 160, and the gate insulating layer 130 may be patterned in the second region A2, and the second contact hole 192 exposing the gate layer 120 is formed.

According to exemplary embodiments, the second area of the second transmission portion 230 is greater than the first area of the first transmission portion 220, and therefore, the energy of the light UV transmitted through the second transmission portion 230 is greater than the energy of the light UV transmitted through the first transmission portion 220. In this manner, the first contact hole 191 is formed including the first size, the second contact hole 192 is formed including the second size equal to or greater than the first size. To this end, the gate layer 120 is exposed even though the organic insulating layer 170 disposed on the source/drain layer 150 includes the first thickness T1 and the organic insulating layer 170 disposed on the gate layer 120 includes the second thickness T2, which is thicker than the first thickness T1. As such, a size (e.g., terminating opening) of the second contact hole 192 at the gate layer 120 is equal to or greater than a size of the first contact hole 192 at the source/drain layer 150.

Referring to FIG. 11C, the conductive electrode 180 is formed on the organic insulating layer 170. That is, the conductive electrode 180 is formed so that the conductive electrode 180 connects the source/drain layer 150 and the gate layer 120 through the first contact hole 191 and the second contact hole 192. As such, the substrate 100 is formed.

According to exemplary embodiments, the exposure mask 200 of FIG. 1 is used to form the first contact hole 191 and the second contact hole 192 through the organic insulating layer 170 of the substrate 100, but it is contemplated that any one of the other exposure masks may be utilized. For example, at least one of the exposure mask 300 of FIG. 3, the exposure mask 400 of FIG. 5, the exposure mask 500 of FIG. 7, and the exposure mask 600 of FIG. 9 may be used to form the first contact hole 191 and the second contact hole 192 through the organic insulating layer 170 of the substrate 100.

According to exemplary embodiments, the first contact hole 191 and the second contact hole 192 may be formed through the organic insulating layer 170 respectively including the first thickness T1 in the first region A1 and the second thickness T2 in the second region A2, using an exemplary exposure mask including a first transmission portion through which a first energy of the light UV is transmitted and the second transmission portion through which a second energy of the light UV is transmitted, such that the second energy is greater than the first energy. In this manner, the source/drain layer 150 and the gate layer 120 may be exposed during a same processing step. Defects of the substrate 100 resulting from the gate layer 120 not being sufficiently exposed may be prevented or otherwise decreased.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A display device comprising:
   a base substrate;
   a first conductive layer on the base substrate;
   a second conductive layer on the base substrate;
   an organic insulating layer on the first conductive layer and the second conductive layer, the organic insulating layer having a first contact hole exposing a first portion of the first conductive layer and a second contact hole exposing a second portion of the second conductive layer; and
   a third conductive layer covering the organic insulating layer, the first contact hole, and the second contact hole,
   wherein the third conductive layer contacts the first portion of the first conductive layer and the second portion of the second conductive layer, thereby the first conductive layer and the second conductive layer are electrically connected, and
   wherein the first portion of the first electrode is equal or greater than the second portion of the second electrode.

2. The display device of claim 1, further comprising:
   a first insulation layer between the first conductive layer and the second conductive layer,
   Wherein the first contact hole is formed through the organic insulating and the first insulation layer.

3. The display device of claim 2, wherein the first conductive layer is at least partially overlapped with the second conductive layer.

4. The display device of claim 1, further comprising:
   a passivation layer between the organic insulating layer and the first and second conductive layers,
   wherein the first contact hole is formed through the organic insulating layer and the passivation layer, and
   wherein the second contact hole is formed through the organic insulating layer and the passivation layer.

5. The display device of claim 1, wherein a depth of the first contact hole is greater than a depth of the second contact hole.

6. The display device of claim 1, further comprising:
   a first insulation layer between the first conductive layer and the second conductive layer,
   wherein the first conductive layer and the second conductive layer include a circuitry wiring of a gate driving part in a peripheral area which is non-display area, and
   wherein the first conductive layer includes a gate line in a display area in which an image is displayed.

* * * * *